United States Patent [19]

Szabo et al.

[11] Patent Number: 4,538,122

[45] Date of Patent: Aug. 27, 1985

[54] DIODE OSCILLATOR WITH INDEPENDENTLY VARIABLE FREQUENCY AND POWER

[75] Inventors: Laszlo Szabo, Korntal; Klaus Schünemann, Braunschweig, both of Fed. Rep. of Germany

[73] Assignee: International Standard Electric Corporation, New York, N.Y.

[21] Appl. No.: 523,546

[22] Filed: Aug. 16, 1983

[30] Foreign Application Priority Data

Aug. 19, 1982 [DE] Fed. Rep. of Germany ....... 3230830

[51] Int. Cl.³ .................. H03B 7/12; H03L 5/02; H03C 3/20
[52] U.S. Cl. ................. 331/96; 331/107 DP; 331/107 SL; 331/177 V; 331/182; 332/30 V; 332/56
[58] Field of Search .................. 331/96, 104, 107 DP, 331/107 SL, 177 V, 182; 332/56, 30 V

[56] References Cited

U.S. PATENT DOCUMENTS 3,803,513  4/1974  Oya et al. ............................. 331/96
4,028,639  6/1977  Hagon et al. ..................... 331/96 X

FOREIGN PATENT DOCUMENTS 1516910  2/1970  Fed. Rep. of Germany ........ 331/74
0053647  4/1977  Japan ..................................... 331/96
0099806  7/1980  Japan ............................... 332/30 V
0065011  4/1982  Japan ..................................... 331/96

Primary Examiner—Eugene R. LaRoche
Assistant Examiner—D. C. Mis
Attorney, Agent, or Firm—John T. O'Halloran; Peter R. Ruzek

[57] ABSTRACT

The oscillator includes a two-terminal device (1) as an active element and an impedance-matching network (4) for matching the two-terminal device to a load (A). The impedance-matching network is formed by a coupler (4) having four terminals (2, 3, 7, 8) two of which (7, 8) are terminated with impedances (5, 6) whose values are chosen depending on the output power or frequency to be adjusted or are varied as desired. Another of the terminals is connected to the active two-terminal device (1), and the fourth terminal (3) is the oscillator output.

16 Claims, 3 Drawing Figures

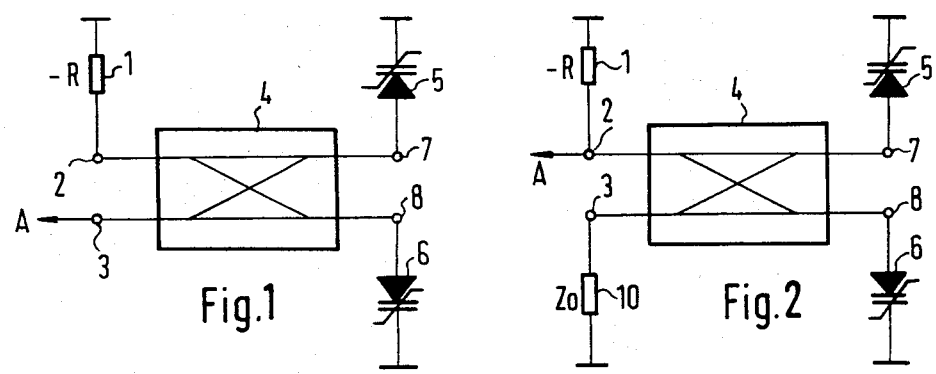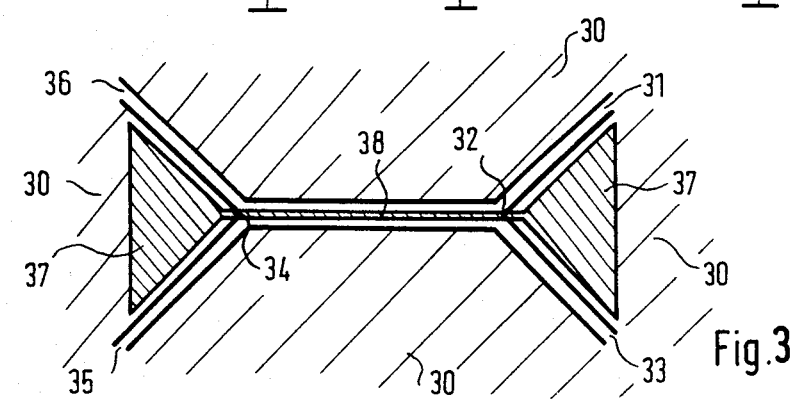

DIODE OSCILLATOR WITH INDEPENDENTLY VARIABLE FREQUENCY AND POWER

The present invention relates to an oscillator for electromagnetic waves, comprising a two-terminal device as an active element, and an impedance-matching network for matching the two-terminal device to a load. An oscillator of this kind is described in an article by L. Szabo et al, "Entwurfskriterien für elektronisch durchstimmbare Oszillatoren in Hohlleitertechnik", Mikrowellen-Magazin 3/78, pages 193–202.

It is frequently desirable to change the frequency and/or the output power of an oscillator. In conventional oscillators, a change in frequency always results in a change in output power, and vice versa.

The object of the invention is to provide an oscillator in which the adjustment/variation of the frequency- and power-determining parameters has only a minimum effect on the output power or frequency that is not newly adjusted/varied.

This object is attained by forming the impedance-matching network by a coupler having four terminals, a respective first and second of the terminals being terminated with variable impedances for independently adjusting or continuously varying the output power and the frequency, respectively. Then, either a third one of the terminals is connected to the active two-terminal device, and a fourth terminal is the oscillator output, or a third one of the terminals is terminated wih a further impedance equal to the characteristic impedance of the coupler, and a fourth terminal is connected to the two-terminal device on the one hand and to the oscillator output on the other hand.

The novel oscillator is particularly suitable for use as an oscillator which can be frequency- and amplitude-modulated. Turning and matching to the load are performed by all-electronic means, i.e., no mechanical adjustments are required. In a preferred embodiment, at frequencies above 15 GHz, the coupler is implemented in fin-line form. This permits the oscillator to be realized as a compact, rugged, and lowcost unit which is little sensitive to dimensional variations.

The invention will now be explained in more detail, by way of example, with reference to the accompanying drawing, in which:

FIGS. 1 and 2 are block diagrams of embodiments, and

FIG. 3 shows the implementation of the coupler in fin-line form.

In both embodiments, the impedance-matching network for matching the oscillator to a load is a coupler 4 having four terminals 2, 3, 7, 8. Connected to the first two terminals 7 and 8 are varactor diodes 5 and 6, respectively. One of the varactor diodes, 5, is used to adjust the frequency of the oscillator, and the other, 6, the output power. If no tunability or no modulation is desired, a bias is applied to the two varactor diodes to obtain the desired values.

If the oscillator is to be continuously tunable or capable of being modulated, the biases applied to the varactor diodes will be suitably changed to control the frequency or the output power. As the two biases for the two diodes can be controlled independent of each other, there is no interaction between the frequency adjustment and the power adjustment.

An active two-terminal device is connected to another terminal 2 of the coupler. A suitable active device is a Gunn diode.

In the first embodiment, shown in FIG. 1, the fourth terminal 3 of the coupler is the output A of the oscillator.

In the second embodiment, shown in FIG. 2, the fourth terminal of the coupler is terminated with an impedance 10. The impedance Zo is chosen to be equal to the characteristic impedance of the coupler. In this case, the terminal 2 of the coupler not only is connected to the active two-terminal device but also represents the output A of the oscillator.

The novel oscillator can be advantageously implemented on a substrate using integrated-circuit techniques, particularly the fin-line technique.

The fin-line technique is known per se, e.g., from "Wissenschaftliche Berichte AEG-Telefunken", 54(1981) 4–5, page 219. A waveguide contains a dielectric substrate on which metallic fins are deposited. The metallic fins form a slot.

A novel coupler based on branch-line couplers in fin-line form will now be described with the aid of FIG. 3. The fin line is unilateral, i.e., metallic fins 30 are deposited on only one side of the substrate. The fins are marked in the drawing by a hatching from the lower left to the upper right. They form slots 31, 33, 35 and 36.

The slot between the points 32 and 34, at each of which two unilateral fin lines meet, is not a fin-line slot as far as its electrical behavior is concerned, but it actually forms a slotted line.

The fin line described represents a coupler only if supplemented with suitably arranged quasi-lumped elements. Suitable elements of this kind are:

a length of wire (not shown in FIG. 3) which is bonded to the fins at the points 32 and 34 and, thus, interconnects these two points. It has the shape of U whose legs are perpendicular to the surface of the fins and connected to these points. The portion of the length of wire which is parallel to the surface of the fins is to be spaced as far as possible from the fins so as to influence the electric field of the fin line as little as possible. Its optimum length is determined by the necessary 90° phase difference between the two coupling arms 31, 33.

a stripline 38 disposed on the side of the substrate opposite the fins. It extends above the slot between the points 32 and 34. To the side of each of these points, the stripline expands into a metal surface 37. These metal surfaces and the fins on the other side of the substrate provide capacitive coupling. The length of the stripline determines the decoupling. The stripline will generally run in a serpentine rather than a straight course in order to provide the 90° phase difference as in the previous case. For this reason, and since the capacitive coupling influences the electrical length of the stripline, the latter can be given a desired electrical length. Care must be taken to ensure that the stripline is positioned so as not to influence the electric field of the fin line as far as possible, and not to form a bilateral fin line.

The coupling ratio, i.e., the ratio in which the energy supplied over a fin line is divided between the two fin lines over which this energy is passed on, will depend, inter alia, on how far the fin lines are longitudinally displaced relative to each other.

By the choice of the coupling ratio, the sensitivity of the control parameters, i.e., the sensitivity of the frequency and amplitude adjustment, can be adjusted. If the oscillator is implemented in fin-line form, the varactor diodes 5, 6 will be bonded directly above the slots formed by the fin lines. The fin lines terminate in short circuits behind the varactor diodes. The active element, i.e., the Gunn diode, is bonded to the fins of another piece of fin line in a corresponding manner.

A large bandwidth is obtained by terminating the piece of fin line behind the Gunn diode with a suitable impedance. If the fin line is terminated with a short circuit, the bandwidth obtainable will be smaller than with the other solution.

Some concluding remarks about the operation of the oscillator. Looking from the Gunn diode (slot 35, FIG. 3), the input reflection coefficient $r_{in}$, which depends on the reflection coefficients $r_2$, $r_3$ of the varactor diodes (at the slots 36 and 33, FIG. 3), is $$r_{in} = \frac{\left(1 - \frac{1}{C}\right)}{r_2} + \frac{r_3}{C},$$

where C is the coupler's coefficient of coupling. This relation can be represented in a Smith chart. It will be seen that $r_2$ influences only the phase of $r_{in}$, while $r_3$ influences almost exclusively the amplitude of $r_{in}$. In the case of a 10-dB coupler, the amplitude varies between 0.8 and 1.1, and the phase by 12 degrees. It is thus possible to adjust the phase and, hence, the frequency of the oscillator by controlling one of the varactor diodes, while the output power can be adjusted with the other varactor diode.

We claim:

1. An oscillator for electromagnetic waves, comprising a two-terminal device (1) as an active element and an impedance-matching network (4) for matching the two-terminal device to a load (A), characterized in that the impedance-matching network is formed by a coupler (4) having four terminals (2, 3, 7, 8), that a respective first and second of the terminals (7, 8) are terminated with variable impedances (5, 6) for independently adjusting or continuously varying the output power and the frequency, respectively, that a third one of the terminals (2) is connected to the active two-terminal device (1), and that a fourth terminal (3) is the oscillator output.

2. An oscillator for electromagnetic waves, comprising a two-terminal device (1) as an active element and an impedance-matching network (4) for matching the two-terminal device to a load (A), characterized in that the impedance-matching network is formed by a coupler (4) having four terminals (2, 3, 7, 8), that a respective first and second of the terminals (7, 8) are terminated with variable impedances for independently adjusting or continuously varying the output power and the frequency, respectively, that a third one of the terminals (3) is terminated with a further impedance (10) equal to the characteristic impedance of the coupler, and that a fourth terminal (2) is connected to the two-terminal device (1) on the one hand and to the oscillator output (A) on the other hand.

3. An oscillator as claimed in claim 1, characterized in that the impedances (5, 6) connected to the first and second terminals (7, 8) are continuously variable independently of each other.

4. An oscillator as claimed in claim 3 characterized in that the coupler is implemented in finline form.

5. An oscillator as claimed in claim 4, characterized in that the active two-terminal device and the impedances are connected to the coupler via fin lines.

6. An oscillator as claimed in claim 5, characterized in that the continuously variable impedances are varactor diodes.

7. An oscillator as claimed in claim 3, characterized in that
the continuously variable impedances are varactor diodes.

8. An oscillator as claimed in claim 4, characterized in that
the continuously variable impedances are varactor diodes.

9. An oscillator as claimed in claim 1, characterized in that
the coupler is implemented in fin-line form.

10. An oscillator as claimed in claim 2, characterized in that
the coupler is implemented in fin-line form.

11. An oscillator as claimed in claim 2, characterized in that
the impedances (5,6) connected to the first and second terminals (7,8) are continuously variable independently of each other.

12. An oscillator as claimed in claim 11, characterized in that
the coupler is implemented in fin-line form.

13. An oscillator as claimed in claim 12, characterized in that
the active two-terminal device and the impedances are connected to the coupler via fin lines.

14. An oscillator as claimed in claim 13, characterized in that
the continuously variable impedances are varactor diodes.

15. An oscillator as claimed in claim 12, characterized in that
the continuously variable impedances are varactor diodes.

16. An oscillator as claimed in claim 11, characterized in that
the continuously variable impedances are varactor diodes.

* * * * *